(12) United States Patent
Fu et al.

(10) Patent No.: US 11,025,248 B2
(45) Date of Patent: Jun. 1, 2021

(54) HYBRID POWER DEVICES

(71) Applicant: Futurewei Technologies, Inc., Plano, TX (US)

(72) Inventors: Dianbo Fu, Frisco, TX (US); Zhaohui Wang, Shanghai (CN); Jun Zhang, Shanghai (CN); Lei Shi, Shanghai (CN)

(73) Assignee: Futurewei Technologies, Inc., Plano, TX (US)

( * ) Notice: Subject to any disclaimer, the term of this patent is extended or adjusted under 35 U.S.C. 154(b) by 0 days.

(21) Appl. No.: 16/296,419

(22) Filed: Mar. 8, 2019

(65) Prior Publication Data

US 2019/0207601 A1 Jul. 4, 2019

Related U.S. Application Data

(62) Division of application No. 15/497,390, filed on Apr. 26, 2017, now Pat. No. 10,230,364.

(51) Int. Cl.
| | |
|---|---|
| *H03K 17/687* | (2006.01) |
| *H03K 17/16* | (2006.01) |
| *H03K 17/06* | (2006.01) |
| *H03K 17/0812* | (2006.01) |
| *H03K 17/567* | (2006.01) |
| *H03K 17/0814* | (2006.01) |
| *H03K 17/74* | (2006.01) |

(52) U.S. Cl.
CPC ........... *H03K 17/168* (2013.01); *H03K 17/06* (2013.01); *H03K 17/08128* (2013.01); *H03K 17/08148* (2013.01); *H03K 17/567* (2013.01); *H03K 17/6874* (2013.01); *H03K 17/6877* (2013.01); *H03K 17/74* (2013.01); *H03K 2017/066* (2013.01)

(58) Field of Classification Search
CPC ............. H03K 17/063; H03K 17/0822; H03K 17/04123; H03K 2217/0036; H03K 17/687
USPC .................................................. 327/427, 434
See application file for complete search history.

(56) References Cited

U.S. PATENT DOCUMENTS

| | | |
|---|---|---|
| 4,941,030 A | 7/1990 | Majumdar |
| 6,332,661 B1 | 12/2001 | Yamaguchi |
| 9,065,326 B2 | 6/2015 | Hafner et al. |
| 9,147,555 B2 | 9/2015 | Richter |
| 9,345,901 B2 | 5/2016 | Peterchev |

(Continued)

FOREIGN PATENT DOCUMENTS

| | | |
|---|---|---|
| CN | 101594131 A | 12/2009 |
| CN | 101814854 A | 8/2010 |

(Continued)

OTHER PUBLICATIONS

Larry Li,"Turn-Off Characteristics of SiC JBS Diodes", USCI, USCi_AN0011, XP055691711, Aug. 1, 2016, 5 pages.

*Primary Examiner* — Quan Tra
*Assistant Examiner* — Anh-Quan Tra
(74) *Attorney, Agent, or Firm* — Slater Matsil, LLP

(57) ABSTRACT

A device includes a first diode and a second diode connected in series between a first terminal and a second terminal of a switching element, wherein the switching element is a unidirectional device and an anode of the first diode is directly connected to an anode of the second diode, a third diode connected between the first terminal and the second terminal of the switching element and a switch connected in parallel with the first diode.

20 Claims, 2 Drawing Sheets

(56) References Cited

U.S. PATENT DOCUMENTS

| | | | |
|---|---|---|---|
| 2003/0042967 A1 | 3/2003 | Middel et al. | |
| 2009/0289691 A1 | 11/2009 | Fuller et al. | |
| 2009/0294799 A1 | 12/2009 | Terashima | |
| 2010/0213915 A1 | 8/2010 | Kora et al. | |
| 2011/0309874 A1* | 12/2011 | Takimoto | H03K 17/0814 327/427 |
| 2013/0009491 A1 | 1/2013 | Hafner et al. | |
| 2013/0062626 A1* | 3/2013 | Takao | H03K 17/127 257/77 |
| 2015/0188452 A1 | 7/2015 | Herzer et al. | |
| 2016/0241030 A1 | 8/2016 | Lacarnoy | |
| 2016/0277022 A1 | 9/2016 | Alexander et al. | |
| 2016/0285371 A1 | 9/2016 | Fu | |
| 2016/0285386 A1 | 9/2016 | Kataoka et al. | |
| 2017/0005511 A1 | 1/2017 | Li et al. | |
| 2017/0019097 A1 | 1/2017 | Sato | |
| 2017/0229917 A1 | 8/2017 | Kurs et al. | |
| 2017/0302196 A1 | 10/2017 | Weng et al. | |

FOREIGN PATENT DOCUMENTS

| | | |
|---|---|---|
| CN | 102647009 A | 8/2012 |
| CN | 102647099 A | 8/2012 |
| CN | 203225654 U | 10/2013 |
| CN | 104113210 A | 10/2014 |
| JP | 2002165439 A | 6/2002 |

* cited by examiner

HYBRID POWER DEVICES

PRIORITY CLAIM AND CROSS-REFERENCE

This application is a divisional of U.S. application Ser. No. 15/497,390, filed on Apr. 26, 2017, entitled "Hybrid Power Devices" which application is hereby incorporated herein by reference.

TECHNICAL FIELD

The present disclosure relates to a device and method for achieving higher breakdown voltage, lower on-resistance and lower switching losses in high voltage applications, and, in particular embodiments, to a hybrid power device and a method of driving the hybrid power device.

BACKGROUND

The Insulated Gate Bipolar Transistor (IGBT) device is a three terminal device including an N-channel Metal Oxide Semiconductor Field Effect Transistor (MOSFET) and a PNP bipolar transistor connected in a Darlington configuration. Such a Darlington configuration enables the IGBT device to have MOSFET input characteristics and bipolar output characteristics. The IGBT device is a voltage-driven bipolar device. The voltage-driven IGBT device exhibits exceptional features such as simple gate-drive characteristics of MOSFETs at the gate-emitter terminals and a high-current and low-saturation-voltage capability of Bipolar Junction Transistors (BJTs) at the collector-emitter terminals.

The IGBT device includes three terminals, namely an emitter, a gate and a collector. In operation, when a gate voltage surpasses a turn-on threshold voltage of the IGBT device, the IGBT device is turned on. On the other hand, the IGBT device is turned off if the gate voltage goes down below the turn-on threshold voltage.

The IGBT device is a unidirectional device. More particularly, the IGBT device can only allow the current to flow in a direction from the collector to the emitter of the IGBT device. In comparison, MOSFET devices have bi-directional current switching capabilities.

IGBT devices are widely used in high power applications, such as inverters for three-phase drives, high voltage converters, uninterruptible power supplies and switching mode power supplies. IGBT devices have a low on-state voltage drop, but their switching speeds are slow. MOSFETs may have higher switching speeds, but high-voltage and high-current MOSFET devices are expensive and hard to achieve.

It would be desirable to have an integrated device for use in high voltage applications (e.g., 600 volts) exhibiting good behaviors such as higher breakdown voltage, lower on-resistance and lower switching losses.

SUMMARY

These and other problems are generally solved or circumvented, and technical advantages are generally achieved, by preferred embodiments of the present disclosure which provide a hybrid switching device having higher breakdown voltage, lower on-resistance and lower switching losses.

In accordance with an embodiment, an apparatus comprises a first diode and a second diode connected in series between a first terminal and a second terminal of a switching element, wherein the switching element is a unidirectional device and an anode of the first diode is directly connected to an anode of the second diode, a third diode connected between the first terminal and the second terminal of the switching element and a switch connected in parallel with the first diode.

In accordance with another embodiment, a method comprises configuring a current to flow through a unidirectional device comprising a first conductive path and a second conductive path, wherein the first conductive path comprises a switch, a first diode and a second diode, and the second conductive path comprises a third diode and turning off the switch before cutting off the current flowing through the unidirectional device.

In accordance with yet another embodiment, a hybrid power device comprises a first diode and a second diode connected in series between a first terminal and a second terminal of a unidirectional apparatus, wherein an anode of the first diode is directly connected to an anode of the second diode, a third diode having an anode connected to a cathode of the second diode, the third diode having a cathode connected to a cathode of the first diode and a switch connected in parallel with the first diode.

An advantage of an embodiment of the present disclosure is a hybrid power device providing higher breakdown voltage, lower on-resistance and lower switching losses.

The foregoing has outlined rather broadly the features and technical advantages of the present disclosure in order that the detailed description of the disclosure that follows may be better understood. Additional features and advantages of the disclosure will be described hereinafter which form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

The present disclosure will be described with respect to preferred embodiments in a specific context, namely a hybrid power device for high voltage and high switching frequency applications. The disclosure may also be applied, however, to a variety of power applications. Hereinafter, various embodiments will be explained in detail with reference to the accompanying drawings.

Figure 1:
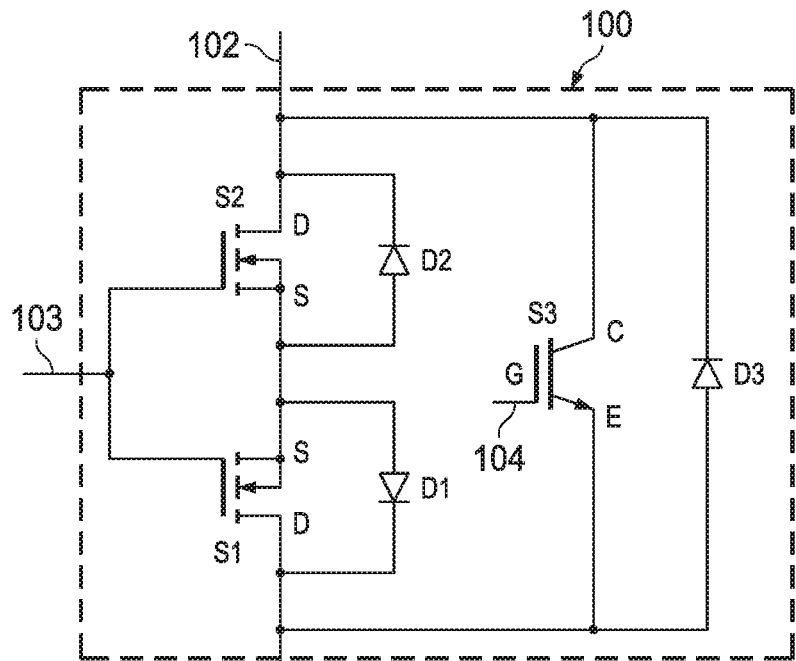
FIG. 1 illustrates a schematic diagram of a hybrid power device in accordance with various embodiments of the present disclosure.

FIG. 1 illustrates a schematic diagram of a hybrid power device in accordance with various embodiments of the present disclosure. The hybrid power device 100 includes a low voltage Metal Oxide Semiconductor Field Effect Transistor (MOSFET) S1, a high voltage MOSFET S2, an Insulated Gate Bipolar Transistor (IGBT) device S3, a first diode D1, a second diode D2 and a third diode D3. The hybrid power device 100 has four terminals, namely a first terminal 101, a second terminal 102, a third terminal 103 and a fourth terminal 104.

As shown in FIG. 1, the IGBT device S3 and the third diode D3 are connected in parallel between the first terminal 101 and the second terminal 102. The cathode of the third diode D3 is connected to the collector of the IGBT device S1 and further connected to the second terminal 102. The anode of the third diode D3 is connected to the emitter of the IGBT device S1 and further connected to the first terminal 101. The gate of the IGBT device S3 is connected to the fourth terminal 104.

The high voltage MOSFET S2 and the low voltage MOSFET S1 are connected in series between the second terminal 102 and the first terminal 101. As shown in FIG. 1, the drain of the high voltage MOSFET S2 is connected to the second terminal 102. The source of the high voltage MOSFET S2 is connected to the source of the low voltage MOSFET S1. The drain of the low voltage MOSFET S1 is connected to the first terminal 101. The gates of the high voltage MOSFET S2 and the low voltage MOSFET S1 are connected together and further connected to the third terminal 103.

The cathode of the second diode D2 is connected to the drain of the high voltage MOSFET S2 and further connected to the second terminal 102. The anode of the second diode D2 is connected to the source of the high voltage MOSFET S2. In some embodiments, the second diode D2 is the body diode of the high voltage MOSFET S2. In alternative embodiments, the second diode D2 may be implemented as a separate component (e.g., a Schottky diode) connected in parallel with the high voltage MOSFET S2.

The cathode of the first diode D1 is connected to the drain of the low voltage MOSFET S1 and further connected to the first terminal 101. The anode of the first diode D1 is connected to the source of the low voltage MOSFET S1. In some embodiments, the first diode D1 is the body diode of the low voltage MOSFET S1. In alternative embodiments, the first diode D1 may be implemented as a separate component (e.g., a Schottky diode) connected in parallel with the low voltage MOSFET S1.

In some embodiments, the high voltage MOSFET S2 is of a voltage rating in a range from about 600 V to about 650 V. The low voltage MOSFET S1 is of a voltage rating in a range from about 60 V to about 100 V. In some embodiments, both the high voltage MOSFET S2 and the low voltage MOSFET S1 are n-channel devices as shown in FIG. 1. Furthermore, the voltage rating of the high voltage MOSFET S2 is ten times greater than the voltage rating of the low voltage MOSFET S1.

The IGBT device S3 is of a voltage rating in a range from about 600 V to about 650 V. The third diode D3 is of a voltage rating in a range from about 600 V to about 650 V.

It should be noted that the voltage ratings above are merely examples. One of ordinary skill in the art would recognize many variations, alternatives, and modifications. For example, depending on different applications and design needs, the voltage rating of the IGBT device S3 may be in a range from about 1000 V to about 1500 V.

In some embodiments, the hybrid power device 100 functions as a switching element. When the switching element is turned on, a current may flow from the second terminal 102 to the first terminal 101. Alternatively, the current may flow from the first terminal 101 to the second terminal 102. The third terminal 103 and the fourth terminal 104 function as control terminals. More particularly, gate drive signals of the hybrid power device 100 are applied to the third terminal 103 and the fourth terminal 104, respectively to control the on/off of the hybrid power device 100.

In operation, the turn-on process of the hybrid power device 100 includes sequentially applying gate drive signals to the third terminal 103 and the fourth terminal 104. More particularly, during the turn-on process of the hybrid power device 100, a first gate drive signal is applied to the third terminal 103. In some embodiments, the first gate drive signal has a voltage higher than the turn-on thresholds of the high voltage MOSFET S2 and the low voltage MOSFET S1. In response to the first gate drive signal applied to the third terminal 103, both the high voltage MOSFET S2 and the low voltage MOSFET S1 are turned on. Then, after a predetermined delay (e.g., 50 nS), a second gate drive signal is applied to the fourth terminal 104. In some embodiments, the second gate drive signal has a voltage higher than the turn-on threshold of the IGBT device S3. In response to the second gate drive signal applied to the fourth terminal 104, the IGBT device S3 is turned on.

It should be noted that since the high voltage MOSFET S2 and the low voltage MOSFET S1 are turned on before the second gate drive signal is applied to the fourth terminal 104, the IGBT device S3 can achieve a zero voltage turn-on.

It should further be noted that since the conductive voltage drop of the IGBT device S2 is much smaller than the conductive voltage drop of the high voltage MOSFET S2 and the low voltage MOSFET S1, the majority of the current of the hybrid power device 100 flows through the IGBT device S3 after the hybrid power device 100 has been turned on.

The IGBT device S3 has a low on-state voltage drop, but the switching speed of the IGBT device S3 is slow. The turn-on sequence discussed above helps the IGBT device S3 achieve a zero voltage turn-on, thereby reducing the switching losses of the IGBT device S3. On the other hand, the low on-state voltage drop of the IGBT device S3 helps to reduce the conductive losses of the hybrid power device 100.

During a turn-off process of the hybrid power device 100, the second gate drive signal applied to the fourth terminal 104 is reduced to a level below the turn-on threshold of the IGBT device S3. As a result, the IGBT device S3 is turned off while the high voltage MOSFET S2 and the low voltage MOSFET S1 remain on. Then, after a second predetermined delay (e.g., 50 nS), the first gate drive signal applied to the third terminal 103 is reduced to a level below the turn-on thresholds of the high voltage MOSFET S2 and the low voltage MOSFET S1. As a result, the high voltage MOSFET S2 and the low voltage MOSFET S1 are turned off.

It should be noted that since the high voltage MOSFET S2 and the low voltage MOSFET S1 are still on during the process of turning off the IGBT device S3, the IGBT device S3 is turned off with zero voltage switching.

It should further be noted that during the turn-on and turn-off processes discussed above, no current flows through the second diode D2 because the first diode D1 blocks the current from entering the second diode D2. In particular, the high voltage MOSFET S2 and the low voltage MOSFET S1 are turned on and off simultaneously. When both the high voltage MOSFET S2 and the low voltage MOSFET S1 are turned on, the current flows through the high voltage MOSFET S2 instead of a high impedance path provided by the second diode D2. On the other hand, when both the high voltage MOSFET S2 and the low voltage MOSFET S1 are turned off, the first diode D1 blocks the current from entering the second diode D2. The hybrid power device 100 does provide a current path for the current flowing from the first terminal 101 to the second terminal 102. The current such as a reverse current may flow through the third diode D3.

In some embodiments, the third diode D3 functions as a freewheeling diode. In some embodiments, the third diode D3 is an ultrafast recovery diode having a low reverse recovery charge and a short reverse recovery time. The voltage rating of the third diode D3 is in a range from about 600 V to about 650 V. Its forward voltage is in a range from about 1.2 V to about 1.8 V.

Figure 2:
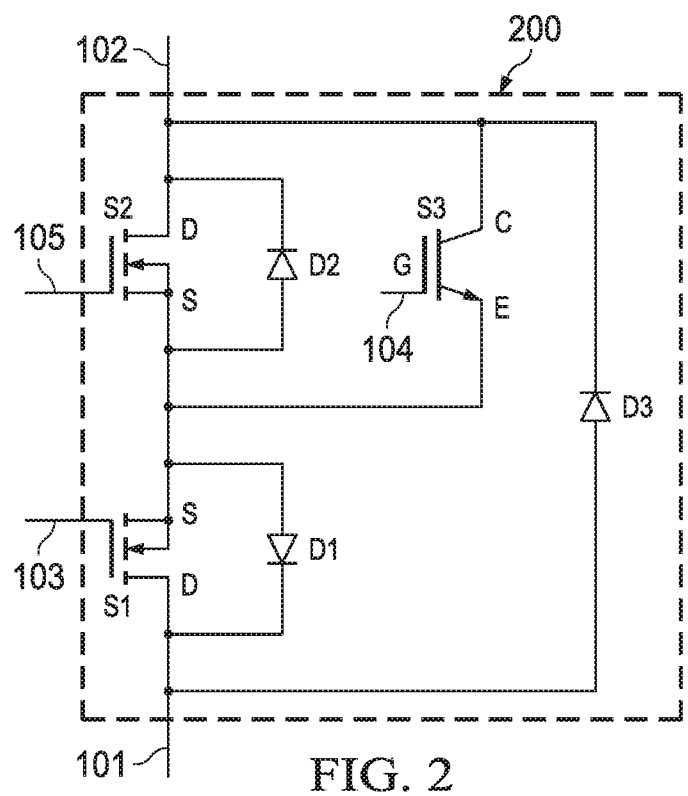
FIG. 2 illustrates a schematic diagram of another hybrid power device in accordance with various embodiments of the present disclosure.

FIG. 2 illustrates a schematic diagram of another hybrid power device in accordance with various embodiments of the present disclosure. The hybrid power device 200 is similar to the hybrid power device 100 shown in FIG. 1 except that the current flows through both the IGBT device S1 and the low voltage MOSFET S3 when the hybrid power device 200 is turned on. As shown in FIG. 2, the IGBT device S3 and the low voltage MOSFET S1 form a conductive path between the second terminal 102 and the first terminal 101. Furthermore, the gate of the low voltage MOSFET S1 and the gate of the high voltage MOSFET S2 are not connected together. Instead, the gate of the high voltage MOSFET S2 and the gate of the low voltage MOSFET S1 are connected to a fifth terminal 105 and a third terminal 103, respectively as shown in FIG. 2.

In operation, during a turn-on process of the hybrid power device 200, both the low voltage MOSFET S1 and the gate of the high voltage MOSFET S2 are turned on before the IGBT device S3 is turned on. There is a first predetermined delay (e.g., 50 nS) between the turn-on of the MOSFETs S1 and S2, and the turn-on of the IGBT device S3.

During a turn-off process of the hybrid power device 200, the IGBT device S3 is turned off before the low voltage MOSFET S1 and the high voltage MOSFET S2 are turned off. There is a second predetermined delay (e.g., 50 nS) between the turn-off of the IGBT device S3 and the turn-off of the MOSFETs S1 and S2.

Figure 3:
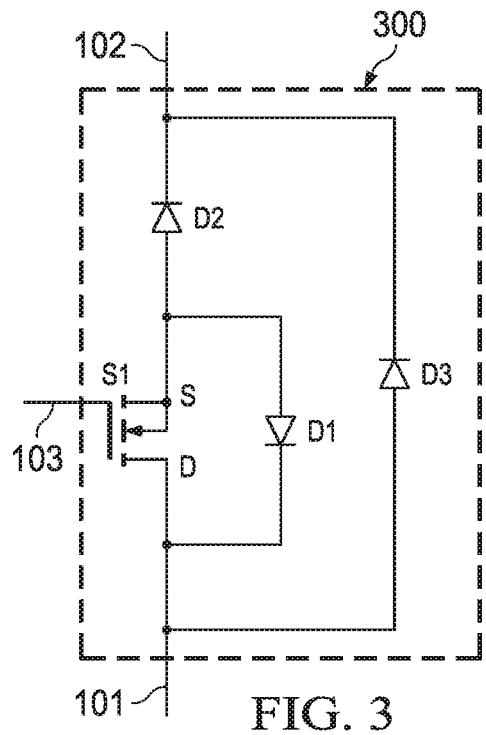
FIG. 3 illustrates a schematic diagram of yet another hybrid power device in accordance with various embodiments of the present disclosure.

FIG. 3 illustrates a schematic diagram of yet another hybrid power device in accordance with various embodiments of the present disclosure. The hybrid power device 300 includes a MOSFET S1, a first diode D1, a second diode D2 and a third diode D3. The second diode D2 and the MOSFET S1 are connected in series between a first terminal 101 and a second terminal 102 of the hybrid power device 300. The first diode D1 and the MOSFET S1 are connected in parallel. The anode of the first diode D1 is directly connected to the anode of the second diode D2. The cathode of the first diode D1 is connected to the drain of the MOSFET S1 and further connected to the first terminal 101. The cathode of the second diode D2 is connected to the second terminal 102.

The third diode D3 is connected between the first terminal 101 and the second terminal 102 of the hybrid power device 300. More particularly, the cathode of the third diode D3 is connected to the second terminal 102. The anode of the third diode D3 is connected to the first terminal 101.

In some embodiments, the third diode D3 is a high voltage and high speed diode. The voltage rating of the third diode D3 is in a range from about 600 V to about 650 V. The third diode D3 functions as a freewheeling diode having a short reverse recovery time and a low reverse recovery charge.

The first diode D1 is a low voltage diode. The voltage rating of the first diode D1 is in a range from about 60 V to about 100 V. The MOSFET S1 is a low voltage MOSFET. The voltage rating of the MOSFET S1 is in a range from about 60 V to about 100 V.

The second diode D2 is a high voltage diode. The voltage rating of the second diode D2 is in a range from about 600 V to about 650 V. The voltage rating of the second diode D2 is approximately equal to the voltage rating of the third diode D3. In some embodiments, the third diode D3 has a shorter reverse recovery time and a lower reverse recovery charge than the second diode D2. The forward voltage drop of the third diode D3 is greater than the forward voltage drop of the second diode D2.

In operation, when a current flows from the first terminal 101 to the second terminal 102, a gate drive signal is applied to the third terminal 103, which is connected to the gate of the MOSFET S1. In some embodiments, the gate drive signal is greater than the turn-on threshold of the MOSFET S1. In response to the gate drive signal, the MOSFET S1 is turned on and the current flows through two conductive paths in parallel. As shown in FIG. 3, a first conductive path is formed by the MOSFET S1 and the second diode D2. The second conductive path is formed by the third diode D3.

The MOSFET S1 is turned off before the current cuts off. In particular, before the current cuts off, the MOSFET S1 is turned off. In addition, the first diode D1 blocks the current from entering the second diode D2. As a result, the current completely flows through the third diode D3. Since the third diode D3 is a high speed diode, the switching transition through the third diode D3 can reduce the switching losses of the hybrid power device 300.

Figure 4:
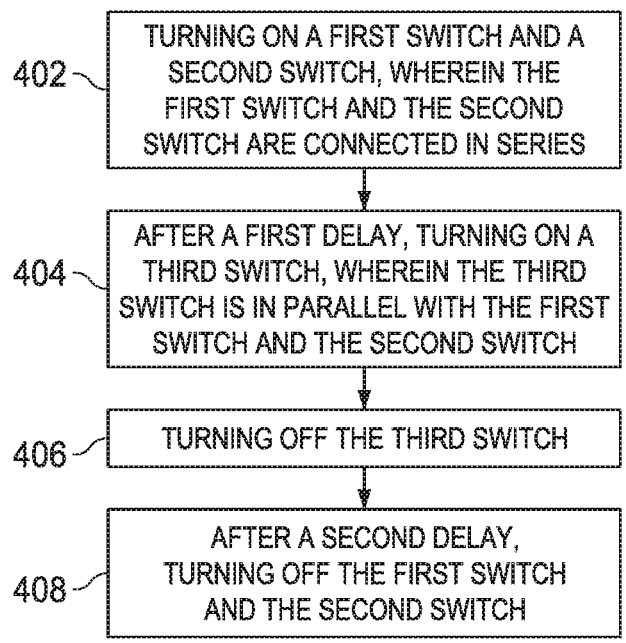
FIG. 4 illustrates a flow chart of a method for controlling the hybrid device shown in FIG. 1 in accordance with various embodiments of the present disclosure.

FIG. 4 illustrates a flow chart of a method for controlling the hybrid device shown in FIG. 1 in accordance with various embodiments of the present disclosure. This flowchart shown in FIG. 4 is merely an example, which should not unduly limit the scope of the claims. One of ordinary skill in the art would recognize many variations, alternatives, and modifications. For example, various steps illustrated in FIG. 4 may be added, removed, replaced, rearranged and repeated.

Referring back to FIG. 1, the hybrid power device 100 comprises three switches and three diodes. The first switch S1 and the second switch S2 are connected in series to form a first conductive path between the first terminal 101 and the second terminal 102. A third switch forms a second conductive path between the first terminal 101 and the second terminal 102. In some embodiments, a conductive loss of the first conductive path is greater than a conductive loss of the second conductive path.

A first diode D1 and a second diode D2 are connected in parallel with the first switch S1 and the second switch S2, respectively. A third diode is connected in parallel with the first diode and the second diode.

At step 402, during a turn-on process of the hybrid power device 100, a first gate drive signal is applied to the gates of the first switch and the second switch. The first gate drive signal has a voltage level greater than the turn-on thresholds of the first switch and the second switch. As a result, the first switch and the second switch are turned on prior to turning on the third switch.

At step 404, after a first delay, a second gate drive signal is applied to the gate of the third switch. The second gate drive signal has a voltage level greater than the turn-on threshold of the third switch. As a result of applying the second gate drive signal to the gate of the third switch, the third switch is turned on.

During the turn-on process of the hybrid power device 100, the first switch and the second switch are turned on prior to the turn-on of the third switch. The first delay is a predetermined value. The first delay may vary depending on different applications and design needs.

At step 406, during a turn-off process of the hybrid power device 100, the second gate drive signal is completely removed or reduced to a level below the turn-on threshold of the third switch. In response to the change of the second drive signal, the third switch is turned off. It should be noted the first switch and the second switch remain on during the process of turning off the third switch.

At step 408, after a second delay, the first gate drive signal is completely removed or reduced to a level below the turn-on thresholds of the first switch and the second switch. In response to the change of the first drive signal, the first switch and the second switch are turned off.

During the turn-off process of the hybrid power device 100, the first switch and the second switch are turned off after the third switch has been turned off. The second delay is a predetermined value. The second delay may vary depending on different applications and design needs.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An apparatus comprising a switching element, wherein the switching element comprises:
   a first diode and a second diode connected in series between a first terminal and a second terminal of the switching element, wherein:
   the switching element is a unidirectional device; and
   an anode of the first diode is directly connected to an anode of the second diode;
   a third diode connected between the first terminal and the second terminal of the switching element; and
   a switch connected in parallel with the first diode, wherein only two conductive paths are between the first terminal and the second terminal of the switching element, and the only two conductive paths form a unidirectional current path of the unidirectional device, and wherein the switch is configured to be turned off before a current flowing through the switch is completely cut off.

2. The apparatus of claim 1, wherein:
the switch is a low voltage Metal Oxide Semiconductor Field Effect Transistor (MOSFET).

3. The apparatus of claim 2, wherein:
a voltage rating of the switch is in a range from about 60 V to about 100 V.

4. The apparatus of claim 1, wherein:
the first diode is a low voltage diode.

5. The apparatus of claim 4, wherein:
a voltage rating of the first diode is in a range from about 60 V to about 100 V.

6. The apparatus of claim 1, wherein:
the second diode is a first high voltage diode having a first reverse recovery time and a first forward voltage drop; and
the third diode is a second high voltage diode having a second reverse recovery time and a second forward voltage drop.

7. The apparatus of claim 6, wherein:
a voltage rating of the second diode is in a range from about 600 V to about 650 V; and
a voltage rating of the third diode is in a range from about 600 V to about 650 V.

8. The apparatus of claim 6, wherein:
the second reverse recovery time of the third diode is shorter than the first reverse recovery time of the second diode.

9. The apparatus of claim 6, wherein:
the second forward voltage drop of the third diode is greater than the first forward voltage drop of the second diode.

10. The apparatus of claim 1, wherein:
a source of the switch is connected to the anode of the second diode; and
a drain of the switch is connected to a common node of the first diode and the third diode.

11. A method comprising:
configuring a current to flow through a unidirectional device comprising a first conductive path and a second conductive path, wherein the first conductive path comprises a switch, a first diode and a second diode, and the second conductive path comprises a third diode, and wherein the first diode and the second diode are connected in series between a first terminal and a second terminal of the unidirectional device, and the switch is connected in parallel with the first diode, and wherein only two conductive paths form a unidirectional current path connected between the first terminal and the second terminal of the unidirectional device; and
turning off the switch before the current flowing through the switch is completely cut off.

12. The method of claim 11, wherein:
an anode of the first diode is directly connected to an anode of the second diode; and
the third diode is connected between the first terminal and the second terminal of the unidirectional device.

13. The method of claim 11, wherein:
a voltage rating of the switch is in a range from about 60 V to about 100 V;
a voltage rating of the first diode is in a range from about 60 V to about 100 V
a voltage rating of the second diode is in a range from about 600 V to about 650 V; and
a voltage rating of the third diode is in a range from about 600 V to about 650 V.

14. The method of claim 11, further comprising:
after turning off the switch, blocking the current from entering into the second diode through the first diode.

15. The method of claim 11, wherein:
a forward voltage drop of the third diode is greater than a forward voltage drop of the second diode.

16. The method of claim 11, wherein:
the third diode has a low reverse recovery charge and a fast reverse recovery time.

17. A hybrid power device comprising a unidirectional apparatus, wherein the unidirectional apparatus comprises:
a first diode and a second diode connected in series between a first terminal and a second terminal of the unidirectional apparatus, wherein an anode of the first diode is directly connected to an anode of the second diode;
a third diode having an anode connected to a cathode of the second diode, the third diode having a cathode connected to a cathode of the first diode; and
a switch connected in parallel with the first diode, wherein only two conductive paths are between the first terminal and the second terminal of the unidirectional apparatus, and the only two conductive paths form a unidirectional current path, and wherein the switch is configured to be turned off before a current flowing through the switch is completely cut off.

18. The hybrid power device of claim 17, wherein:
the switch and the first diode have a voltage rating in a range from about 60 V to about 100 V.

19. The hybrid power device of claim 17, wherein:
the second diode and the third diode have a voltage rating in a range from about 600 V to about 650 V.

20. The hybrid power device of claim 17, wherein:
a source of the switch is connected to a common node of the first diode and the second diode; and
a drain of the switch is connected to a common node of the first diode and the third diode.

* * * * *